United States Patent

Harame et al.

[11] Patent Number: 5,119,157
[45] Date of Patent: Jun. 2, 1992

[54] SEMICONDUCTOR DEVICE WITH SELF-ALIGNED CONTACT TO BURIED SUBCOLLECTOR

[75] Inventors: David L. Harame, Mohegan Lake; Bernard S. Meyerson; Johannes M. C. Stork, both of Yorktown Heights, all of N.Y.

[73] Assignee: International Business Machines Corporation, Armonk, N.Y.

[21] Appl. No.: 664,681

[22] Filed: Mar. 5, 1991

Related U.S. Application Data

[62] Division of Ser. No. 327,627, Mar. 24, 1989, abandoned.

[51] Int. Cl.$^5$ .............................................. H01L 29/72
[52] U.S. Cl. ........................................ 357/34; 357/43; 357/89
[58] Field of Search ............................ 357/34, 43, 89

[56] References Cited

U.S. PATENT DOCUMENTS 4,979,008 12/1990 Siligoni et al. ........................ 357/34

Primary Examiner—Edward J. Wojciechowicz
Attorney, Agent, or Firm—John J. Goodwin

[57] ABSTRACT

A P− semiconductor material substrate which has been ion-implanted with N−type dopants to form an N+ subcollector layer is annealed in Argon to further remove implant damage and drive the dopant ions deeper into the P substrate. Next a lightly doped N− epitaxial layer is grown on the N+ subcollector layer. This forms the blanket collector. A P− well region is formed by growing a pad oxide of 10 nm on the N−epi layer and a 200 nm layer of nitride is then deposited on top of the layer oxide. A photoresist etch mask is used to pattern the P− well region. A reactive ion etch is performed through the dielectric oxide and nitride layers, through the epitaxial layer and stopping in the subcollector layer. A layer of low temperature expitaxial material is grown over the structure using ultra-high vacuum/chemical vapor depositions such that the epitaxial layer extends above the surface of the epitaxial layer and includes a P+ heavily doped layer and a lightly P−doped surface layer. The heavily doped P+ layer provides the low resistance contact to the collector region and the lightly doped P−layer is the collector region and its thickness is determined by the diffusion of the heavily doped layer during the entire process.

2 Claims, 1 Drawing Sheet

SEMICONDUCTOR DEVICE WITH SELF-ALIGNED CONTACT TO BURIED SUBCOLLECTOR

This application is a division of Ser. No. 07/327627 filed Mar. 24, 1989, now abandoned.

BACKGROUND OF THE INVENTION

1. Field of the Invention

The present invention relates to complementary bipolar and MOS integrated circuit semiconductor devices and processes, and more particularly to a semiconductor device with a P− well, and a fabrication method for forming a buried P+ subcollector with a self-aligned reachthrough using a low temperature expitaxial and planarization technique.

2. Description of the Prior Art

U.S. Pat. No. 3,838,440 issued Sep. 24, 1974 to McCaffrey et al entitled A MONOLITHIC MOS/-BIPOLAR INTEGRATED CIRCUIT STRUCTURE describes an integrated circuit with a MOS device including an N+ region formed by a combination of epitaxial growth and ion implantation which provides a pocket filled with higher resistivity, lightly doped N type material. Over extended growth and etch back are not shown or discussed in the patent.

The publication FORMATION OF PLANAR n+ POCKETS IN GaAs FOR MIXER DIODE FABRICATION, by James A. Griffin et al, IEEE Transactions on Electron Devices, Vol. Ed-31, No. 8, August 1984, pages 1096–1099 describes a technique to produce thick n+ "pockets" of highly conducting epitaxial material on the substrate surface in semi-insulating GaAs bulk material. The pockets are formed by the growth of a liquid-phase epitaxial (LPE) layer into holes which had been etched into the substrate and surface uniformity is obtained by chemo-mechanically polishing the substrate surface.

SUMMARY OF THE INVENTION

An object of the present invention is to provide a buried P+ subcollector with a self-aligned reachthrough for an integrated circuit device.

Another object of the present invention is to provide a fabrication method for forming a buried P+ subcollector with a self-aligned reachthrough using a low temperature epitaxial and planarization technique.

A further object of the present invention is to provide a complementary bipolar or CMOS device having a P− well with a buried P+ layer with a free, self-aligned P+ reachthrough.

Still another object of the present invention is to provide a UHV/CVD epitaxial process to form a buried P+ subcollector isolated P− well with a free, self-aligned P+ reachthrough at the edge of the well for formation of a subcollector contact.

Another object of the present invention is to provide a bipolar vertical PNP transistor structure with a P− well and buried P+ layer.

DESCRIPTION OF A PREFERRED EMBODIMENT

Figure 1:
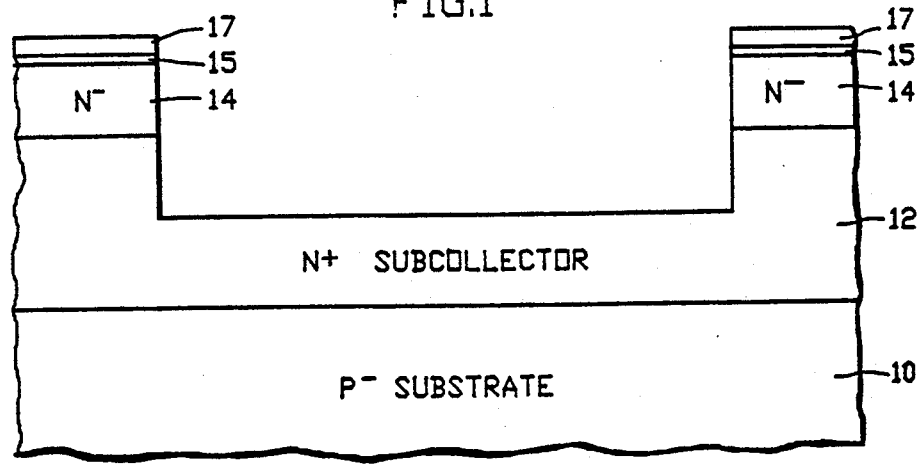
FIG. 1 is a schematic cross-sectional view of a semiconductor device structure according to the present invention including a substrate layer, a subcollector layer, an epitaxial layer and a well region disposed in said epitaxial and subcollector layers.

Referring to FIG. 1, a P− semiconductor material substrate 10 has been ion-implanted with N-type dopants to form an N+ subcollector layer 12. A typical process used to do this would be to implant $1.5 \times 10^{\neq} 1/cm^2$ Arsenic ions through a screen oxide and then give the implant a long oxidizing anneal for 30 minutes at 1100° C. in steam. This is followed by an anneal in Argon to further remove implant damage and drive the arsenic dopant ions deeper into the P substrate. Next a lightly doped N− epitaxial layer 14 is grown on the N+ subcollector layer 12. Typical thicknesses and doping concentrations are 1.2 μm and $5 \times 10^{15}$ $1/cm^3$. This forms the blanket collector which is the starting place for many bipolar processes. As such, it is well practiced and characterized. The objective of the present invention is to not alter this starting material and use epitaxial techniques to deposit a subcollector and collector layer for a complementary device.

To form a P− well region, a pad oxide 15 of 10 nm is grown on the N− epi layer 14 and a 200 nm layer of nitride 17 is then deposited on top of the layer oxide. A photoresist etch mask is used to pattern the P− well region. A reactive ion etch is performed through the dielectric oxide and nitride layers, through the epitaxial layer 14 and stopping in subcollector layer 12. The etched P− well region is shown in FIG. 1. By the end of a typical bipolar process, the N+ subcollector can be as wide as 1.5 microns.

The depth of the P well is limited to the thickness of the N− epi (1.2 μm plus some percentage of the 1.5μ wire N+ subcollector. Thus, the P well must be less than 2.7μ in the present discussed embodiment. A total depth of 1.5 microns is selected.

Figure 2:
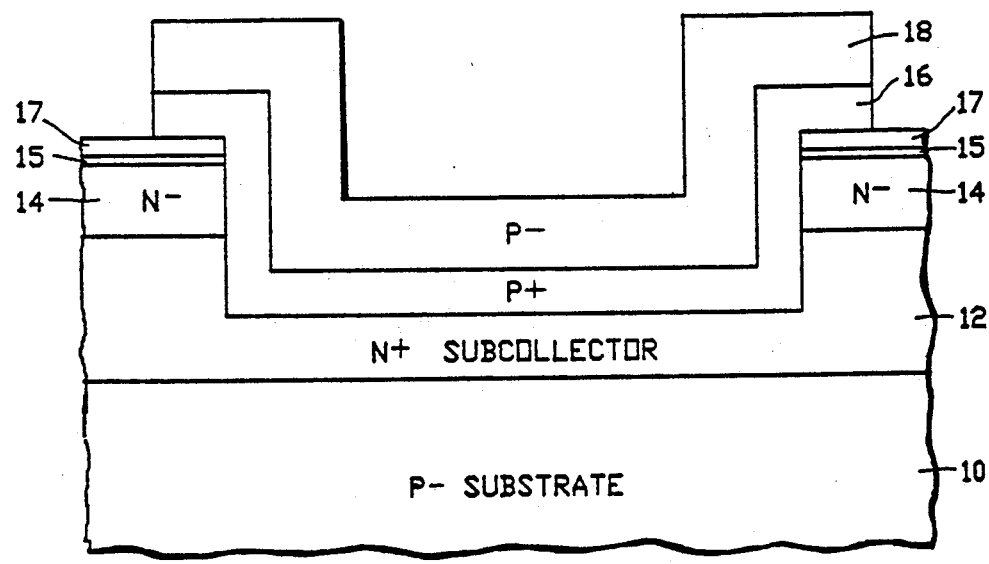
FIG. 2 is a schematic cross-sectional view of the semiconductor device structure of FIG. 1 after subsequent deposition and etching of an epitaxial layer.

In FIG. 2, a layer of low temperature expitaxial material is grown over the structure of FIG. 1 using ultra-high vacuum/chemical vapor depositions such that the epitaxial layer extends above the surface of layer 14 and includes a P+ heavily doped layer 16 and a lightly P− doped surface layer 18. Layer 16 may also include a more lightly doped layer directly in contact with layer 14 to improve yield from defects occurring due to immediately growing a P+ epitaxial layer on top of a heavily doped N+ layer. The total thickness of layers 16 and 18 should be equal to the depth of the P− well to guarantee the most planar structure. Layer 16 provides the low resistance contact to the collector region and should be as heavily doped and wide as possible. Layer 18 is the collector region and its thickness is determined by the diffusion of layer 16 during the entire process. With low temperature processing, layer 18 can be less than 0.4 microns. The low temperature processing includes 700° C. high pressure oxidation for all oxidation steps, and PTA anneals for any defect annealing steps. With more standard and conventional processing, the thickness of layer 18 must be at least 1.2 microns. Using a mix of the two processing approaches, a 0.8 micron layer 18 thickness and a 0.7 micron layer 16 thickness is achieved in the embodiment.

Several methods may be possible to establish layers 16 and 18. In the preferred method they should be deposited by the UHV/CVD technique. This method has achieved chemical concentrations of boron greater than $5 \times 10^{21} 1/cm^3$. In addition very lightly doped levels of boron is also easily achievable. The UHV/CVD technique is also capable of incorporating Ge to compensate the strain produced by the heavily doped boron layers. For example, if the boron concentration was $2 \times 10^{21}$ in layer 16, a desirable germanium concentration would be five times the boron concentration or approximately 20% Ge. This ability to dope films heavily with boron and compensate the stress makes it feasible to have a thin low resistance subcollector in layer 16. A second approach would be to use a reduced pressure selective epitaxial technology. Reduced pressure systems have achieved $1 \times 10^{20} 1/cm^3$ concentrations of boron at 900° which is adequate. The reduced pressure systems also have selective growth capability. The approach in the selective reduced pressure case would be to overgrow and planarize so that defects are reduced and final structure is planar. The selective approach is simpler in that the masking and etching step shown in FIG. 2 is not required. The preferred method is the UHV/CVD technique because of the control of dopant concentration over a wide range, which is non selective.

The epitaxial layers 16 and 18 are patterned with a mask larger than the described P— well region and reactive ion etched to provide the structure of FIG. 2. The mask overlap is between 3–5 microns outside of the initial P— well mask. The purpose is to prevent "breaking" high aspect silicon structures during the polish. It is a well known procedure for those skilled in the art of chem-mech polish.

Figure 3:
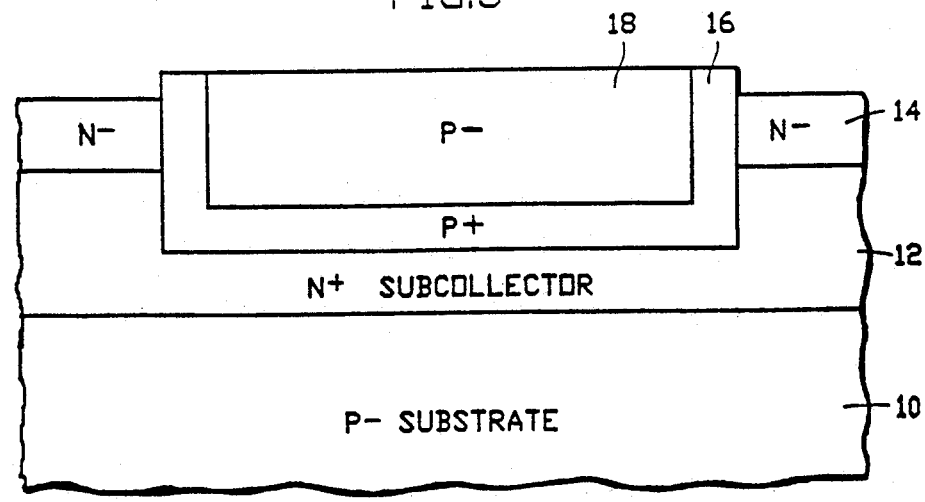
FIG. 3 is a schematic cross-sectional view of the semiconductor device structure of FIG. 2 after subsequent planarization.

The structure of FIG. 2 is planarized using chemical-mechanical techniques to provide the structure of FIG. 3 including a planar P— well region 18 with a P+ subcollector contact ring 16 around the vertical transistor device.

The structure of FIG. 3 is particularly suited to complementary bipolar technology where a blanket subcollector for the NPN structure is used and where integrating the PNP structure is desired with as little modification of existing NPN processes. The present invention provides advantages over forming a P— well by Ion/Implant steps. Ion/Implant has several deficiencies, the most notable being that in the NPN process, the epi-thickness is selected to be as thin as possible. The P— well must be ion-implanted on top of the N+ subcollector and still leave room for the formation of the PNP base. If there is sufficient room to do this and achieve a low resistance subcollector, then the original epi-thickness was much too thick. The present invention does not have that problem. Because the N-epi and a large portion of the N+ subcollector can be removed by the etch step, the PNP profile and NPN profile are no longer tightly coupled. Each can be independently optimized. The NPN profile is optimized by the N— epitaxial layer thickness and the PNP profile is optimized by the thickness and doping concentrations of layer 18 and layer 16.

Another advantage of the present invention is the non-critical nature of the junction quality at the N+ subcollector/P++ P— well layer. The devices are not isolated by that junction but by a deep trench in the usual bipolar process. As long as the epitaxial crystalline quality remains, there are no limits on the dopant concentrations.

A further advantage of the described invention is the provision of reduced collector resistance by the self-aligned reachthrough.

Having thus described our invention, what we claim as new, and desire to secure by Letters Patent is:

1. In an integrated circuit vertical PNP transistor device structure of the type having a substrate, a collector, a subcollector and a well into which an emitter and base can be implanted with a self-aligned subcollector reachthrough contact the improvement comprising
    a semiconductor substrate of first conductivity type,
    a first doped, opposite conductivity type semiconductor layer having a first doping concentration disposed on said substrate to provide a subcollector region,
    a second doped, opposite conductivity type semiconductor layer disposed on said subcollector layer to form a collector region,
    a well structure recessed into said first and second doped layers, said well structures including therein low temperature expitaxial material composed of a stratum of P+ semiconductor material disposed on top of said subcollector region and extending up to the surface level of said second doped layer and a stratum of P— semiconductor material in said well and disposed on said P+ stratum and coplanar with said surface level of said second doped layer to form a P— well into which an emitter and base can be implanted wherein said P+ stratum includes continuous vertical portions external to said P— well which extend to said surface level to provide a contact from said subcollector region to said surface of said second doped layer.

2. An integrated circuit device structure according to claim 1 wherein said semiconductor substrate is composed of P— material,
    said first doped layer is an N+ subcollector and said second doped layer is an N— collector layer for a CMOS device.

* * * * *